United States Patent
Hollricher et al.

[11] Patent Number: 5,859,464
[45] Date of Patent: Jan. 12, 1999

[54] OPTOELECTRONIC DIODE AND COMPONENT CONTAINING SAME

[75] Inventors: Olaf Hollricher, Neu-Ulm; Frank Rüders; Christoph Buchal, both of Jülich; Hartmut Roskos, Aachen; Jens Peter Hermanns, Berlin; Elard Stein Von Kamienski, Aachen; Klaus Rademacher, Kall-Benenberg, all of Germany

[73] Assignee: Forschungszentrum Julich GmbH, Julich, Germany

[21] Appl. No.: 732,233

[22] PCT Filed: Mar. 28, 1995

[86] PCT No.: PCT/DE95/00422

§ 371 Date: Sep. 26, 1996

§ 102(e) Date: Sep. 26, 1996

[87] PCT Pub. No.: WO95/26572

PCT Pub. Date: Oct. 5, 1995

[30] Foreign Application Priority Data

Mar. 29, 1994 [DE] Germany ............. 44 10 799.4

[51] Int. Cl.⁶ ............. H01L 31/00; H01L 31/0232; H01L 27/095; H01L 29/47
[52] U.S. Cl. ............. 257/454; 257/432; 257/485; 257/486; 257/453
[58] Field of Search ................. 257/432, 454, 257/461, 485, 486

[56] References Cited

U.S. PATENT DOCUMENTS 4,829,353  5/1989  Tei .
4,884,112  11/1989  Lorenzo et al. ............. 257/86
5,005,901  4/1991  Moldovan ............. 257/454
5,006,906  4/1991  Deri ............. 257/432
5,122,852  6/1992  Chan et al. ............. 257/184
5,140,381  8/1992  Badoz et al. .
5,250,147  10/1993  Mantl et al. .
5,359,186  10/1994  Fonash et al. ............. 250/214
5,448,099  9/1995  Yano ............. 257/452

FOREIGN PATENT DOCUMENTS 0 378 112 A2  7/1990  European Pat. Off. .

OTHER PUBLICATIONS

"32 Ghz metal–semiconductor–metal photodetectors on crystalline sylincon" by Chou et al. (Applied Physics Letters (61(1992) 12 Oct., No. 15, NY, US).

"Vertical silicon metal–semicondictor–metal photodetectors with buried $CoSi_2$ contact" by Hermanns (Appl. Phus. Lett. 66(7), 13 Feb. 1995).

"Mesiotaxy: Single–crystal growth of Buried $CoSi_2$ layers" by White et al. (Appl. Phys.Lett. 50 (2) 12 Jan. 1987).

Primary Examiner—Jerome Jackson, Jr.
Assistant Examiner—Allan R. Wilson
Attorney, Agent, or Firm—Herbert Dubno

[57] ABSTRACT

An optoelectronic component has an $Al_2O_3$ or Si substrate having a surface on which a buried $CoSi_2$ layer is provided, a Si layer overlying the buried $CoSi_2$ layer. A metal layer on a portion of this latter Si layer forms a diode between the metal layer, the underlying portion of the Si layer and the buried $CoSi_2$ layer and a waveguide for a transparent portion of the metal layer delivers photon energy to the underlying portion of the Si layer.

3 Claims, 11 Drawing Sheets

SCHEMATIC CHARACTERISTIC OF THE CONDUCTIVITY BAND AND VALENCE BAND IN A THIN SILICON LAYER BETWEEN TWO BIASED METAL LAYERS (MSM-DIODE) $\Phi_B$ SIGNIFIES THE SCHOTTKY BARRIER HEIGHT AND $E_F$ THE RESPECTIVE FERMI ENERGY IN METAL 1 AND 2 AND $E_L$ OR $E_V$ THE ENERGY LEVELS OF THE CONDUCTIVITY BAND AND THE VALANCE BAND.

OPTOELECTRONIC DIODE AND COMPONENT CONTAINING SAME

CROSS REFERENCE TO RELATED APPLICATIONS

This application is a national stage of PCT/DE95/00422 filed 28 Mar., 1995 and based upon German national application P44 10 799.4 of 29 Mar. 1994 under the International Convention.

FIELD OF THE INVENTION

The invention relates to a diode with a semiconductive layer and with metallically conducting layers surface-bonded to this semiconductive layer. The invention further relates to a component containing such a diode.

BACKGROUND OF THE INVENTION

Modern optocommunications with its extremely high transmission band widths has made the development of ever more rapid components for information processing necessary. The information, which is transmitted by means of light pulses in glass fiber cables, must be converted into an electrical signal for signal processing. This is effected with fast photodiodes whose electrical resistance changes upon irradiation with light. If an electrically-biased photodiode is illuminated with a short pulse, a voltage pulse is generated which can be further processed by an electronic circuit connected downstream thereof.

It is known from Appl. Phys. Lett. 61 (15), P. 1760–1762 that so-called MSM (metal semiconductor-metal) diodes with the smallest possible electrode spacing can be used. For this purpose a first metallically-conducting layer and a further second metallically-conducting layer are provided upon a substrate for the purpose of forming two electrodes. To optimally utilize a focussed light on the one hand and to keep the current flow region in the same conductive material as small as possible from electrode to electrode, the electrodes are configured to be planar with interdigitating finger structures. As a result, short electrode spacings of several $\mu$m can be achieved whereby the switching time of such devices can then be determined substantially by the transit time of the charge carriers between the electrodes. Typical switching times with a finger spacing of 1 $\mu$m lie in the magnitude range of 10–20 ps. It is however disadvantageous with such diodes that because of the lithographic resolution, there are limits to the reduction in the finger spacing so that even the achievable switching times are limited.

The elemental semiconductor silicon is characterized by good technological dominance even for its ever increasing integration density of components. On physical grounds, however, it is not possible to fabricate from it optoelectronic components like, for example, photodiodes and semiconductive lasers. On the other hand it is highly desirable to realize the most important components which will become increasingly important in the future, for optical communications technology on a basis of silicon. To date, however, the high demands on the field of data transmission have required operation with optical glass fibers with a wavelength of 1.54 $\mu$m since there is an absolute minimum in the absorption. As a result, transmission rates of 10 Gbit/s can be obtained. Even the generation of such high data rates is no longer a problem today because of the use of lasers with modulators. A problem is, however, the "reading" of these large data quantities, i.e. the rapid detection of ultra-short optical pulses. Conventional photo detectors of III–IV semiconductors or also of silicon are not capable of processing these data quantities. The reading of the data forms, at this point in time, a bottleneck in the optical communication technology.

OBJECTS OF THE INVENTION

It is an object of the invention to provide a diode, especially a photodiode of the aforedescribed kind, with which the switching time can be improved. It is also an object of the invention to provide a component with such a diode.

SUMMARY OF THE INVENTION

The objects are achieved with a diode with a semiconductor layer and metallically-conducting layers surface bonded thereto, one of the conducting layers being electrically bonded with one contact surface, the other conducting layer being electrically bonded with the other contact surface of the semiconductive layer. The one metallically-conducting layer can be formed as light permeable and the other metallically-conducting layer can be bonded with a substrate.

The material for the light-permeable layer can be a material that forms with the material of the semiconductive layer the highest possible Schottky barrier. The material for the other metallic layer can be $CoSi_2$. On the semiconductive layer a layer with a waveguide function can be coupled.

The material for the layer with the waveguide function and be the material of the semiconductive layer. The material for the layer with the waveguide function can be silicon or $SiO_2$.

It has been found that by the use of a vertical arrangement of the first metallically-conducting, semiconductive and, second metallically-conducting layers, the transit time of the charge carriers can be sufficiently reduced that the switching time of the diode no longer depends upon the transit time of the generated charge carriers but only upon the RC time constant of the layer structure. Since the lengths of the current channels of the charge carrier in this case is determined by the layer thickness of the semiconductive layer and this can be selected to be extremely small, with the aid of known techniques, especially with layer thicknesses significantly below 1 $\mu$m, particulary in the range of 0.1 to 0.4 $\mu$m, the diode of the invention by contrast with known horizontally-structured MSM devices, can have a significantly improved switching time.

It is advantageous one metallically-conducting layer is light permeable, while the other metallically-conducting layer is connected with a substrate. It is especially advantageous when the material for the light permeable layer forms with the material of the semiconductive layer the highest possible Schottky barrier.

In the silicon technology significant to the field of optocommunications, the diode of the invention has, as the metallic layer bonded to the substrate, $CoSi_2$. It can thus be configured as a base surface in the form of a metallic $CoSi_2$ layer buried in a silicon substrate. Such a structure can be fabricated for example by ion beam synthesis as is described in Appl. Phys. Lett. 50 (1987), P. 95 or also with the aid of the so-called allotaxy process as is known for example from DE-OS 41 13 143. Advantageously the metallic $CoSi_2$ layer is buried in silicon whereby the overlying silicon is monocrystalline so that compatibility with silicon electronics is completely assured.

As the material for the first metallically-conducting layer configured as to its function as a counterelectrode, basically any metal can be optionally selected. To the extent that this material forms the highest possible Schottky barrier with the semiconductive material, especially a silicon, the shadow current of the photo switch is advantageously minimized.

The layer thickness of this light-permeable counter-electrode can then be so chosen that it is semitransparent and permits passage of perhaps 50% of the light used. The contacting of the diode is possible in the usual coplanar conductor technology, although a microstrip conductor technology is possible whereby the $CoSi_2$ layer can serve as a grounded base surface.

Altogether the diode of the invention has in summary the following advantages:

1. A submicrometer structuring is not required for the fabrication of such a diode.

2. Compatibility is fully ensured by silicon technology especially by choice of a buried $CoSi_2$ layer with overlying monocrystalline silicon cover.

3. A coupling to other components, for example, transistors in microstrip conductor technology, is possible, especially when buried $CiSo_2$ is used as the grounded base surface.

4. The diodes of the invention can have a switching time which is no longer limited by the transmit time but rather is limited only by the RC-time constant of the diode when the semiconductor layer neighboring to both metallically conductive layers is configured as thin as possible. By contrast with known diodes of this kind, a significant improvement in the switching time is reached.

In case the material of the waveguide is identical to the semiconductive material, the construction of the components is simplified. To the extent that silicon is chosen as a material, it can be used for optocommunications at the preferred wavelength of 1.54. In the case of the choice of $SiO_2$, even visible light can be used for communication.

The above characteristics of the diode of the invention are also applicable to the featured component.

BRIEF DESCRIPTION OF THE DRAWING

The above and other objects, features, and advantages will become more readily apparent from the following description, reference being made to the accompanying drawing in which:

FIG. 6b is an energy diagram for the system of FIG. 6a;

SPECIFIC DESCRIPTION

Figure 1:
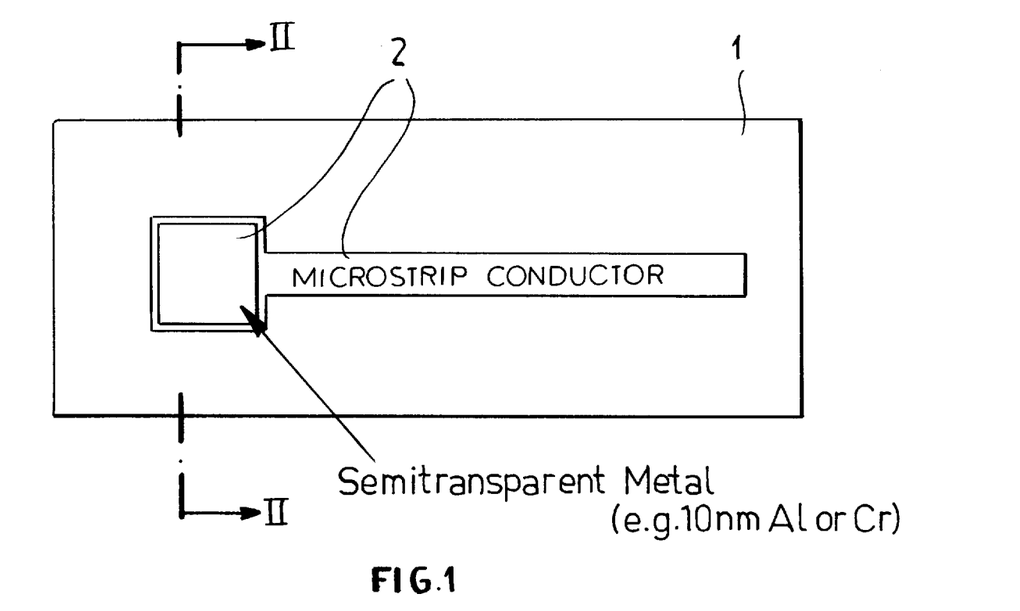
FIG. 1 is a plan view of a diode according to the invention.

In FIG. 1, a diode of the invention with a vertical metal-semiconductor-metal structure is layered at 1, 2 and 3, whereas in a microstrip conductor embodiment, a semitransparent metal has been illustrated as the counter electrode 2 in a plan view. As the counterelectrode a 10 nm thick aluminum or chromium layer is provided.

Figure 2:
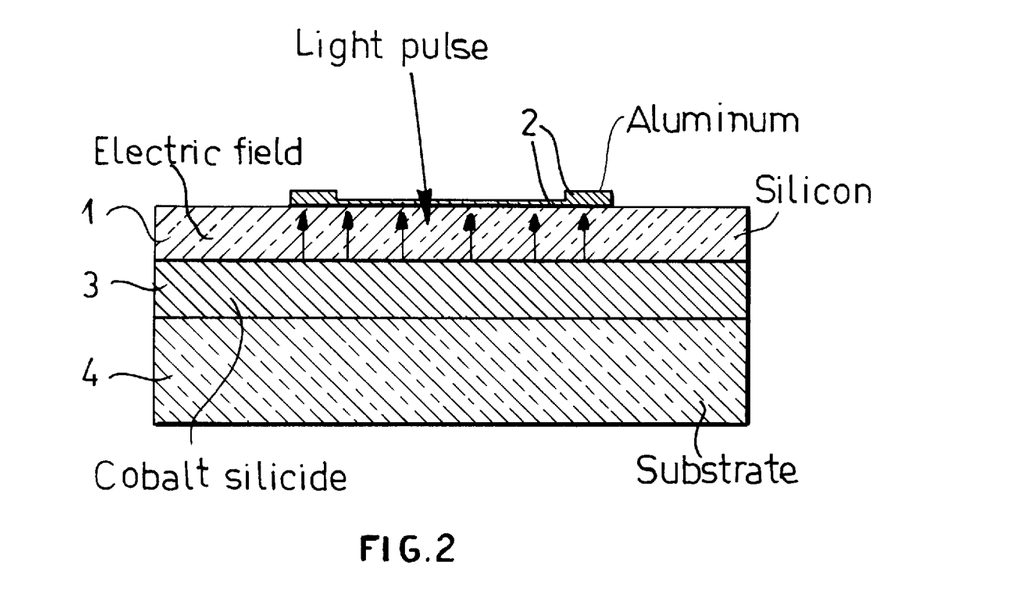
FIG. 2 is a cross section along the line II—II of FIG. 1.

In FIG. 2 in a schematic cross sectional illustration of the diode of the invention (taken along the line II—II) it has been shown how the light passes through the semitransparent aluminum electrode 2 into the semiconductive silicon region 1 for the formation of charge carriers. It deals with a diode as shown which is of a type such that, in the silicon substrate, there is buried the other metallically conducting layers in the form of $CoSi_2$. The layer thickness of the semiconductive silicon layer 1 has a variation for example in the range of 50 to 500 nm; the layer thickness of the buried cobalt silicide base electrode is for example 100 nm.

Figure 3:
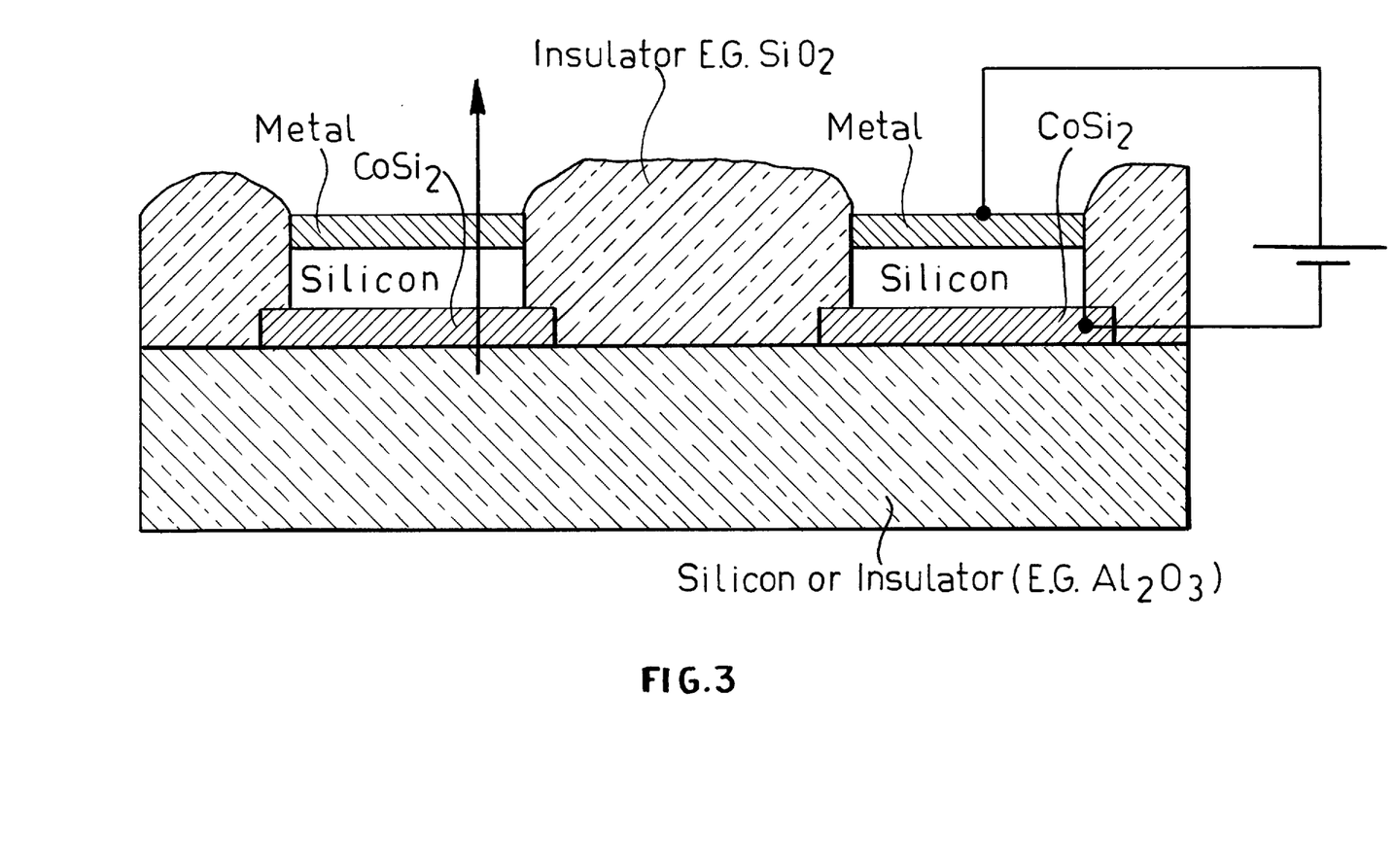
FIG. 3 is a cross section through another embodiment of a component provided with a plurality of diodes in accordance with the invention.

The subject matter of the invention is not limited to a vertical stack of alternating metallic semiconductive and metallic layers upon a substrate surface. Rather, the perpendicular orientation of the layer sequence can also extend parallel to the substrate surface. Then the layers of the MSM diode function are oriented perpendicular to the substrate surface as in FIGS. 4 and 5 for example by comparison to a—two fold—MSM diode structure as shown in FIG. 3. The perpendicular layer orientation of the MSM diode structure has been indicated by an arrow in FIGS. 3–5.

FIG. 3 shows a structure in silicon with two MSM diodes separated by electrically insulating material. The insulator is $SiO_2$. As the material for the respective buried electrodes of the respective diode, $CoSi_2$ is selected. The substrate is, for example, $Al_2O_3$. Schematically illustrated for the MSM diode for the right side, the tapping off of the electrical signals at the two metallic electrodes 2 and 3, for example "metal" and "$CoSi_2$".

Figure 4:
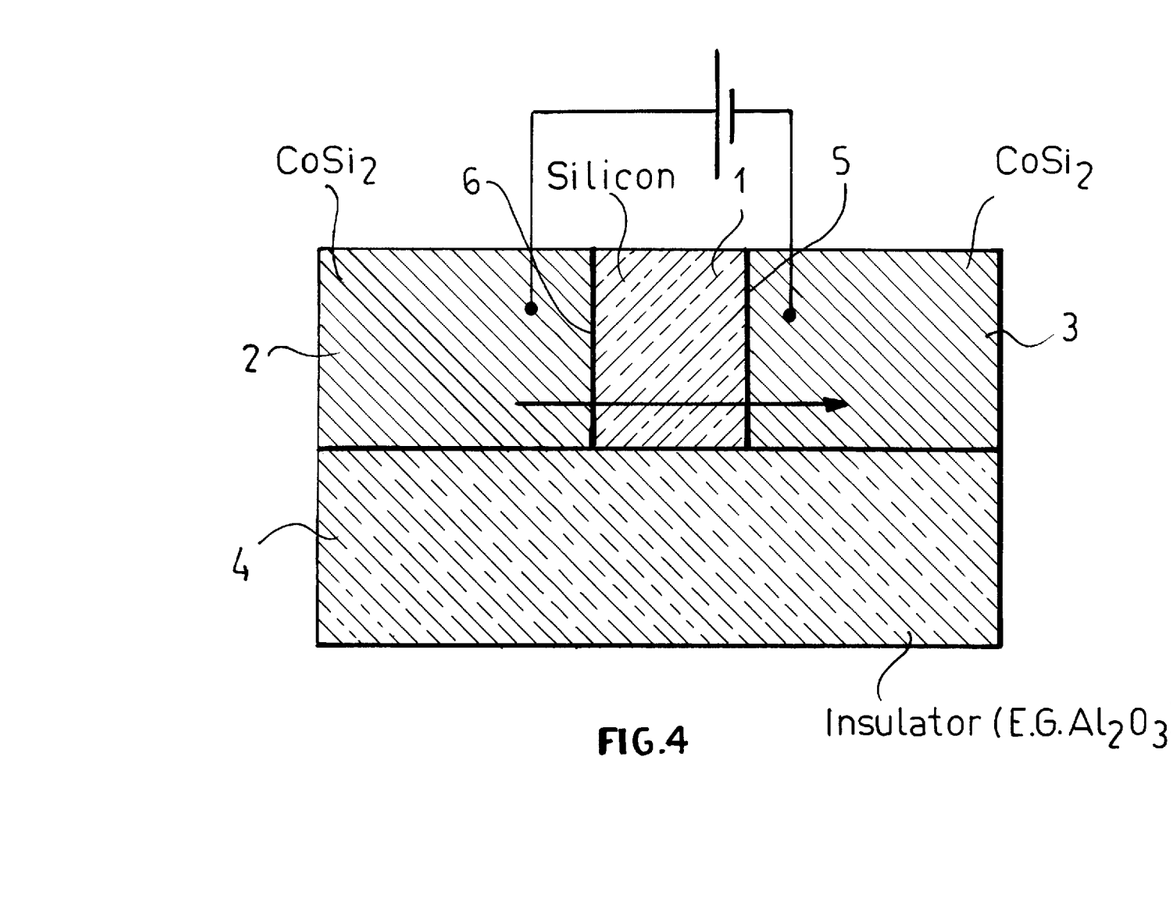
FIG. 4 is a section showing a stacking of conductives of silicon portions parallel to their interface with the substrate or insulator.
Figure 5:
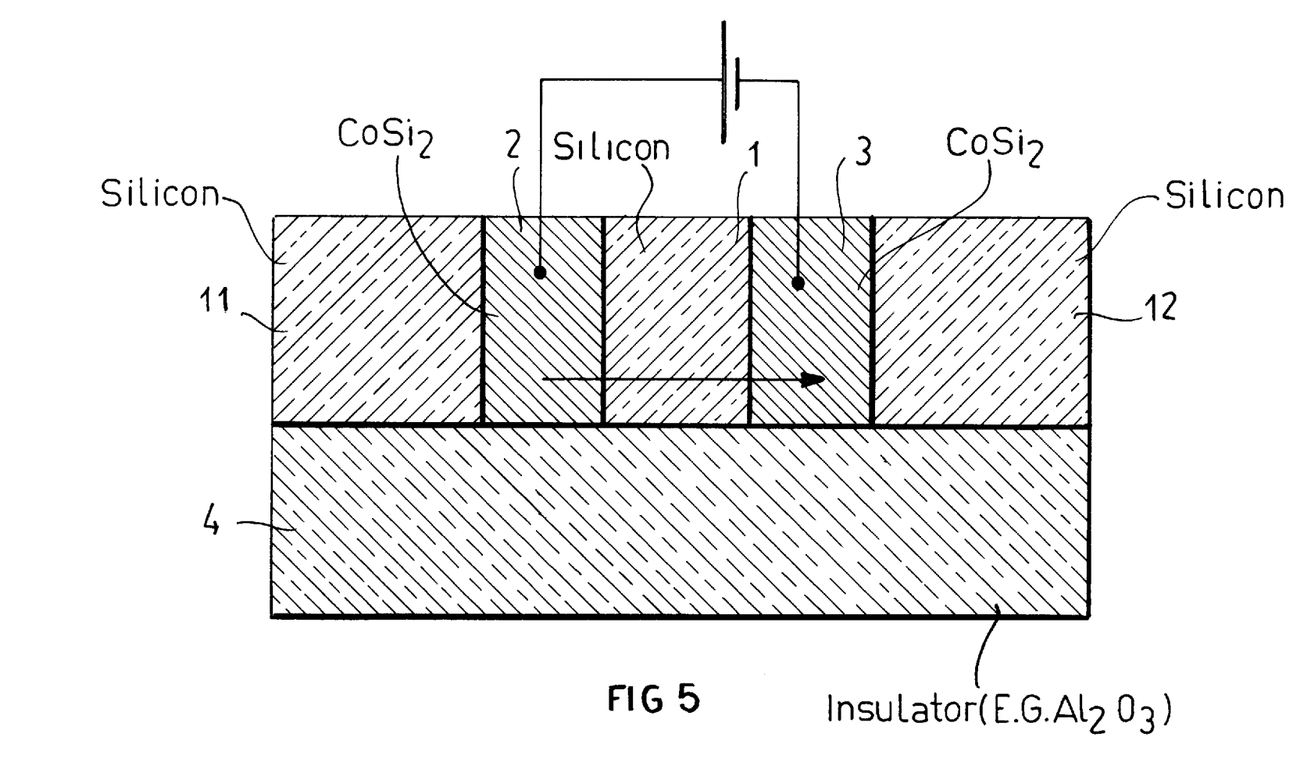
FIG. 5 is a diagram of an electronic component utilizing the same principles as those of FIG. 4.

In FIG. 4 and 5, first and second $CoSi_2$ regions 2 and 3 are formed in a semiconductive silicon layer. The silicon layer 1 is formed on a substrate 4 of $Al_2O_3$. The metallic layer 2 or 3 is thereby connected with the contact surface 6 or 5 of the silicon layer 1. The silicon regions 11 and 12 in FIG. 5 can be provided to form further MSM diode functions. Depending upon the choice of boundary conditions, one or more of the $CoSi_2$ regions are configured as light permeable.

From a process aspect, for the formation of metallic $CoSi_2$ regions in such a silicon layer, an implantation with Co in this layer with the aid of suitable mask techniques is used. In this manner one obtains in a relatively simple way a more or less high number of MSM diode functions in the integrated form significant for silicon technology.

Typical dimensions of the elements of such an MSM diode structure according to the invention for ultrashort pulse answer times, lie in the range of 10 nm (for the formation of a semitransparent electrode for incident light) up to 200 nm for the thickness a of the metallic layer 2, in the range of 70 nm up to 500 nm for the thickness d of the semiconductive silicon layer 1, and in the range of 100 nm up to 300 nm for the thickness c of the metallic $CoSi_2$ layer 3. The lateral dimension b of the MSM diode structure is in the range of 5 $\mu$m up to 40 $\mu$m.

Figure 6:
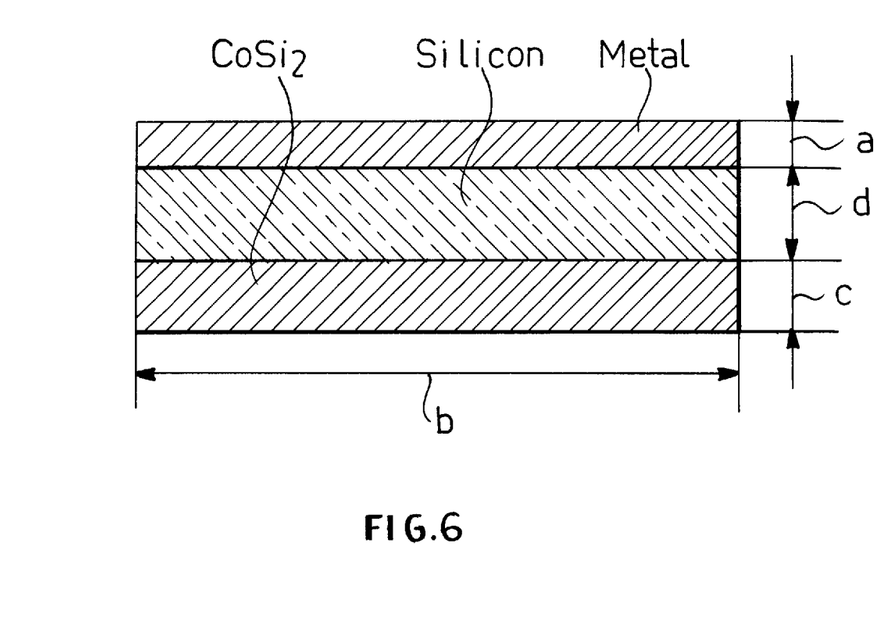
FIG. 6 is a cross sectional view diagrammatically showing the various dimensions of a diode of the type shown in FIGS. 1–3.

The diodes are thus laterally square but for special purposes can also be rectangular. The dimensions a, b, c and d are schematically given in FIG. 6. The MSM diode of the invention is not limited to the dimensions given here.

Further Figures relate to a component which contains a light waveguide and a vertical metal-semiconductor-metal diode on especially an insulating substrate. With the aid of the internal photo effect, photons which can be coupled into a waveguide from a glass fiber guide can excite electrons over the Schottky barrier at one of the metal electrodes. These then are accelerated between the metal layers to the other electrode from a high electric field, giving a rise to a short current-flow or a voltage pulse.

Figure 6A:
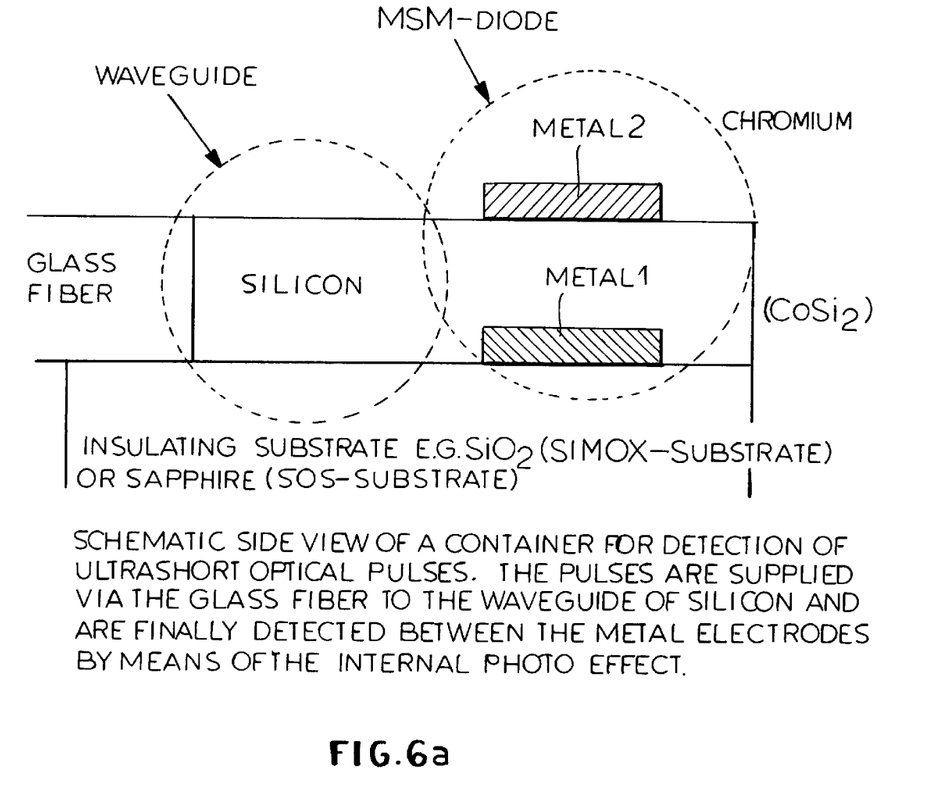
FIG. 6a is a diagram illustrating the use of a waveguide in conjunction with the diode configuration of FIG. 6.

A component with MSM diodes and a coupled integrated waveguide is set forth which permits a detection of ultrashort pulses and is integratable in silicon technology. This component is further detailed in the subsequent Figures, especially FIG. 6a.

The significant part of this structure is the vertical MSM diodes. These diodes are characterized in that based upon the Schottky effect and by the application of an external voltage, the conductivity band and valance band in the semiconductor can be so modified that there are no free charge carriers between the metal layers or so that each generation of charge carriers gives rise to an acceleration of the electrons and the holes to the metal electrodes.

Figure 6B:
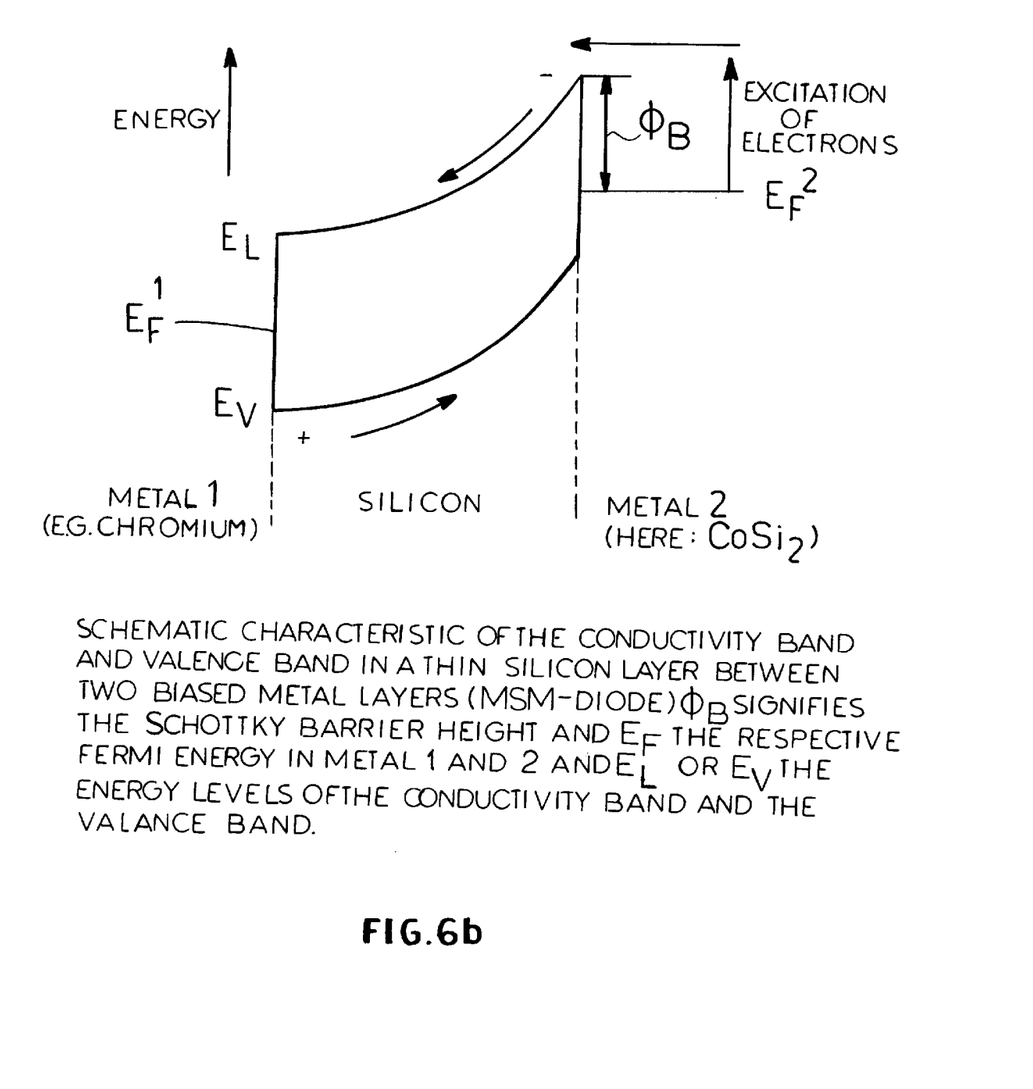

The band characterized has been schematically illustrated in FIG. 6b in which the second metal layer is biased positively relative to the metal 1. The incident photons (1.54 $\mu$m which corresponds to an energy of about 0.8 eV) are not able to generate electron pairs in silicon although it is possible to excite electrons in the metal electrodes. If the excitation is effected as in FIG. 6b in metal 2 above the Schottky barrier $\theta_B$, the electrons can penetrate into the semiconductor and can be accelerated to the counterelectrode by the electric field which is provided. This effect is called the internal photo effect.

As the metal electrode, buried $CoSi_2$ is especially suitable since an epitaxial growth is possible with silicon. Apart from this, the Schottky barrier height of $CoSi_2$ is about 0.64 eV, i.e. being smaller than 0.8 eV, so that an excitation of electrons over the barrier is possible. Since the silicon layer is relatively thin (about 1 nm) a relatively high electric field strength exists between the metal contacts. This gives rise additionally to ready reduction of the Schottky barrier height (with respect to the image charge) or to an increase in the number of electrons which are accelerated to the counter-electrode. With the aid of this diode, electric pulses with a half width of less than 10 ps can be realized. To exclude parasitic effects, an insulating substrate can be used. For this purpose an SIMOX substrate (with a buried $SiO_2$ layer) or an SOS substrate (epitactic silicon on sapphire) can be used. These substrates are desirable so that a jump is achieved in the refractive index from the silicon to the substrate to realize silicon waveguides.

The production of a component according to the invention with an MSM diode structure and an integrated waveguide coupled thereto is further described in the subsequent FIGS. 7–10.

Figure 7:
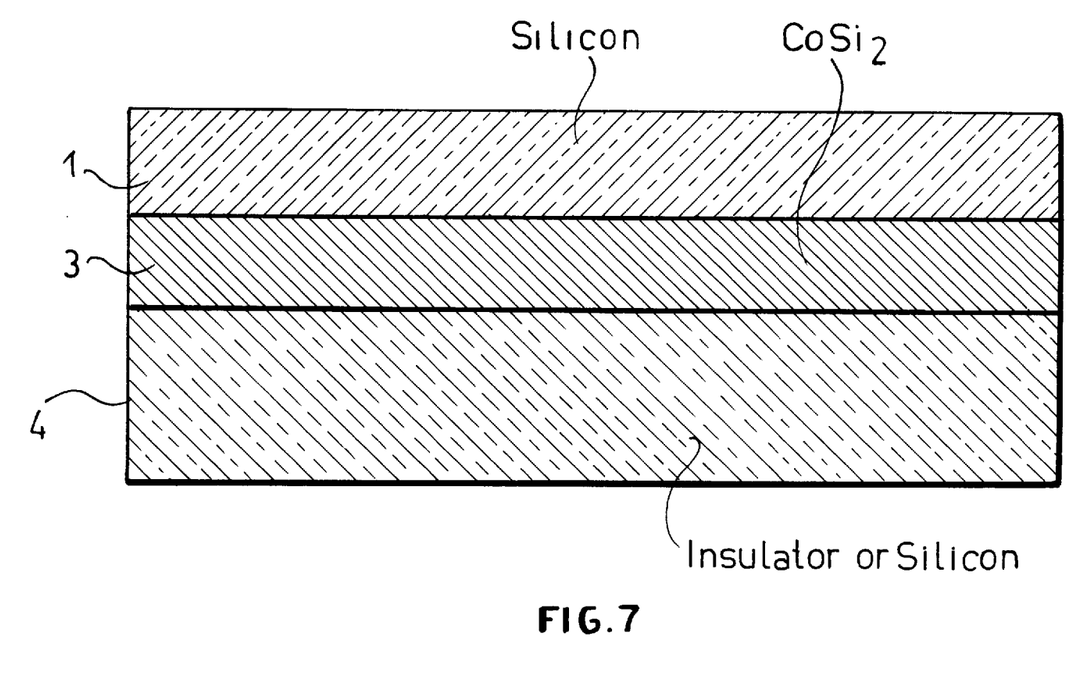
FIG. 7 is a cross sectional view through a buried layer stack prior to the formation of a diode according to the invention.
Figure 8:
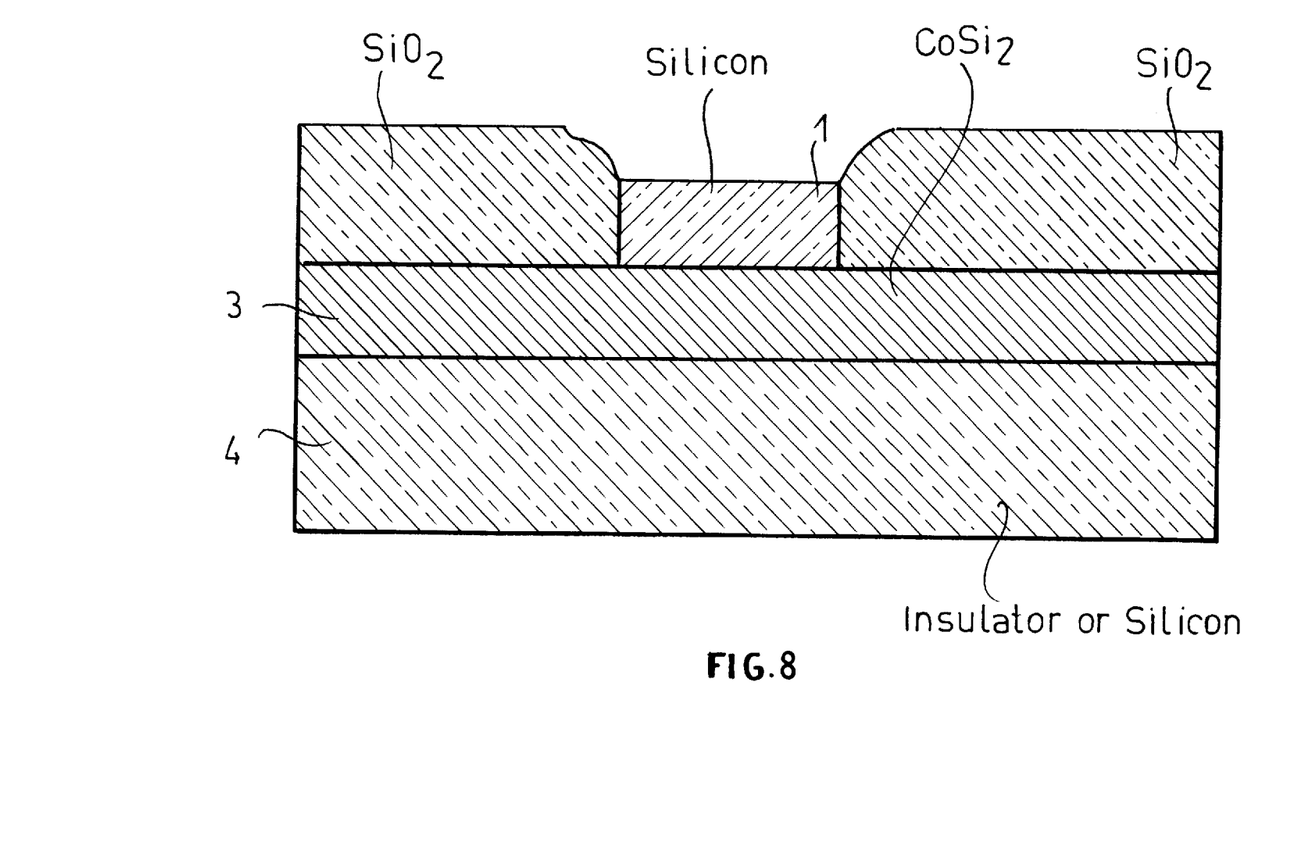
FIG. 8 is a cross sectional view through a further stage in the process of forming the diode.
Figure 9:
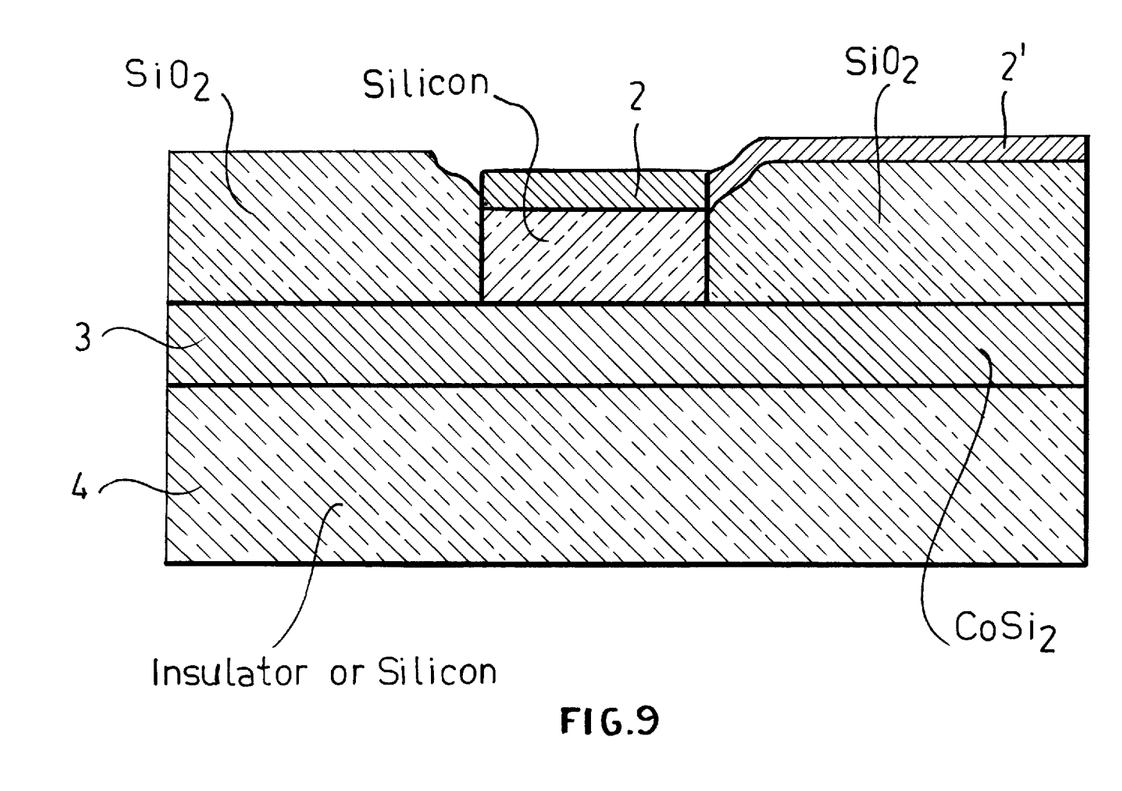
FIG. 9 is a view similar to FIG. 8 showing still a later stage.

In FIG. 7, a substrate 4, for example, of silicon is shown bonded with a metallic $CoSi_2$ layer 3. on the metallic layer a semiconductive silicon layer 1 is provided. Thereafter, for forming a distinct waveguide region of silicon, neighboring regions of the silicon layer 1 are oxidized to $SiO_2$ (FIG. 8). Thereafter as is shown in FIG. 9, a metallic top contact 2 is applied to part of the surface of the layer structure which up to then can be modified. A feed line 2' of the same or optionally of another metallic material is bonded to the top contact 2.

Figure 10:
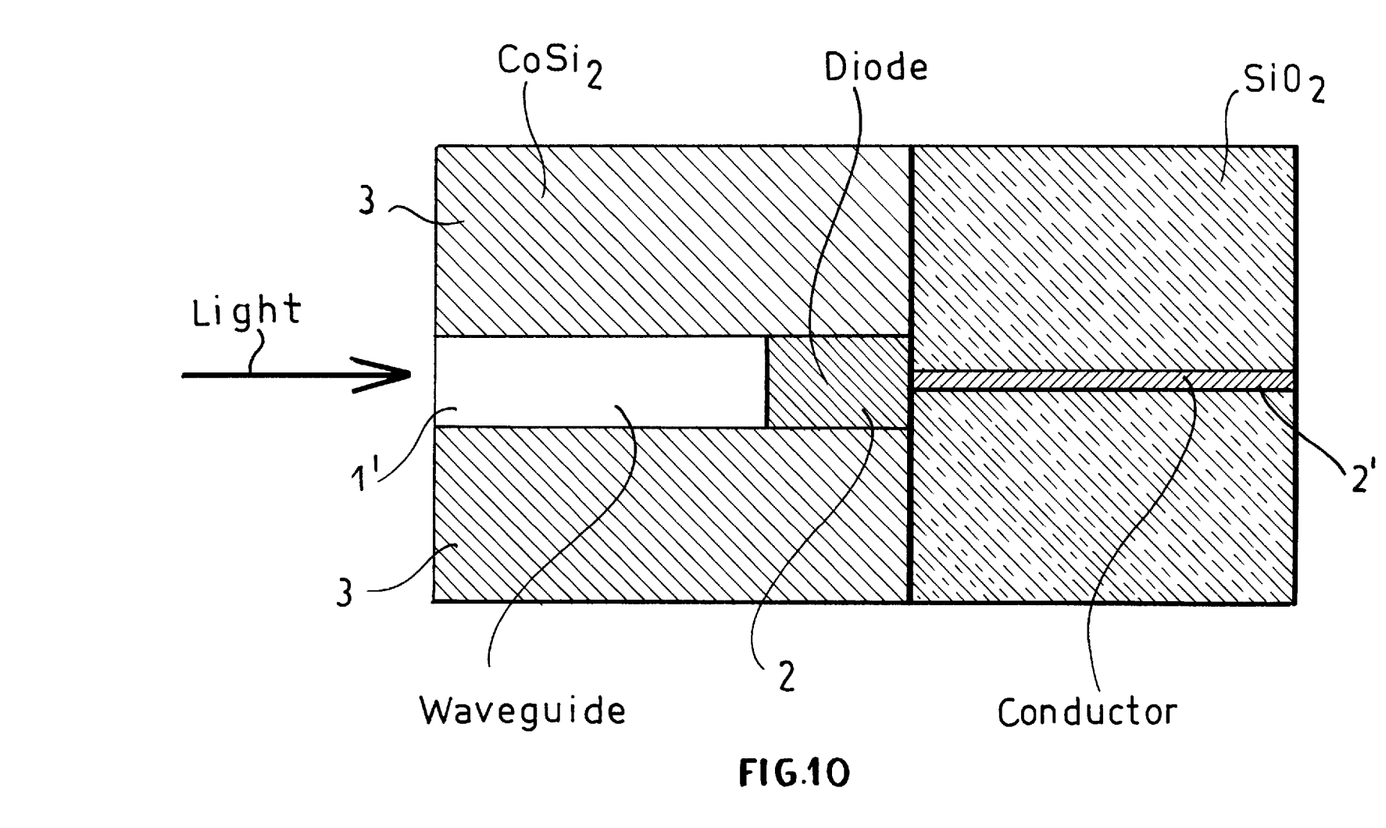
FIG. 10 is a view of the diode showing the waveguide connected to the silicon portion between the two conductors of the diode.

In FIG. 10, the result of the structure according to FIG. 9 is shown from above in which after formation of the geometry of the waveguide, a portion of the $SiO_2$ on both sides of the $CiSi_2$ layer of the waveguide is removed up to the $CoSi_2$ layer. The electrical conductor 2' runs to the metallic top contact 2 of the MSM diode. Below the top contact the semiconductor layer 1 of silicon and the further metallic $CoSi_2$ layer 3 are covered to form the MSM diode function. A strip-shaped $SiO_2$ layer region 1' is coupled to the semiconductor layer 1 of this diode for carrying out the function of the integrated waveguide. To this waveguide, an external glass fiber supplying especially visible light can be coupled and further delivered to the MSM diode and there converted into an electrical signal. Generally it is proposed to form the top contact so that it is optionally light permeable.

By contrast to the components shown in FIGS. 7–10, it is proposed for the formation of the waveguide in the $SiO_2$ region, not to oxidize it and thereby form in this way a waveguide of silicon which can then have an uninterrupted connection with the semiconductive silicon layer of the MSM diode. Such a waveguide as an MSM diode-containing component is of considerable significance for the wavelength of 1.54 $\mu$m significant for optical communication.

We claim:

1. An optoelectronic component comprising:

an $Al_2O_3$ or Si substrate having a surface;

a buried $CoSi_2$ layer on said surface;

an Si layer overlying said buried $CoSi_2$ layer;

a metal layer overlying said Si layer and forming a diode with an underlying portion of said Si layer and a region of said buried $CoSi_2$ layer underlying said portion; and means for supplying photon energy to said underlying portion of said Si layer in the form of a light waveguide terminating at said underlying portion of said Si layer and flanked by bodies of $SiO_2$ or $CoSi_2$.

2. The optoelectronic component defined in claim 1 wherein a plurality of said diodes are formed on said substrate.

3. The optoelectronic component defined in claim 1 wherein said metal layer is composed of aluminum or chromium.

* * * * *